United States Patent
Mora-Puchalt et al.

(10) Patent No.: US 12,244,278 B2
(45) Date of Patent: Mar. 4, 2025

(54) CAPACITIVE AMPLIFIER WITH LOW KICKBACK FROM SWITCHABLE FEEDBACK CAPACITORS

(71) Applicant: Analog Devices International Unlimited Company, Limerick (IE)

(72) Inventors: Gerard Mora-Puchalt, Catarroja (ES); Italo Carlos Medina Sánchez Castro, Valencia (ES); Jesús Bonache Martinez, Mutxamel (ES)

(73) Assignee: Analog Devices International Unlimited Company, Limerick (IE)

( * ) Notice: Subject to any disclaimer, the term of this patent is extended or adjusted under 35 U.S.C. 154(b) by 567 days.

(21) Appl. No.: 17/684,288

(22) Filed: Mar. 1, 2022

(65) Prior Publication Data
US 2023/0283251 A1    Sep. 7, 2023

(51) Int. Cl.
*H03F 3/45*    (2006.01)
(52) U.S. Cl.
CPC .................. *H03F 3/45475* (2013.01)
(58) Field of Classification Search
CPC ........................................................ H03F 3/45
USPC .............................................. 330/260, 9, 69
See application file for complete search history.

(56) References Cited

U.S. PATENT DOCUMENTS

| | | | |
|---|---|---|---|
| 5,479,121 A | 12/1995 | Shen et al. | |
| 5,923,206 A | 7/1999 | Levinson | |
| 7,088,273 B1 | 8/2006 | Perdoor et al. | |
| 7,605,732 B2 | 10/2009 | Koe et al. | |
| 7,920,022 B2 * | 4/2011 | Josefsson | H03F 1/26 330/9 |
| 8,026,760 B1 * | 9/2011 | Prasad | H03F 3/45475 330/311 |
| 8,184,184 B2 | 5/2012 | Xue | |
| 8,258,818 B2 | 9/2012 | Debnath et al. | |
| 8,319,550 B2 * | 11/2012 | Prasad | H03F 1/0205 330/69 |
| 8,471,740 B2 | 6/2013 | Dino et al. | |
| 8,624,632 B2 | 1/2014 | Bulzacchelli | |
| 8,994,564 B2 | 3/2015 | Hurrell et al. | |
| 9,293,986 B2 | 3/2016 | Thandri et al. | |
| 9,405,309 B2 | 8/2016 | Biziitu et al. | |
| 9,535,530 B2 | 1/2017 | Cho et al. | |

(Continued)

OTHER PUBLICATIONS

Zhong, Longjie, "Precision Improvement of Power-Efficient Capacitive Senor Readout Circuit Using Multi-Nested Clocks", IEEE Transactions on Circuits and Systems—I: Regular Papers, 67(8), (2020), 2578-2587.

*Primary Examiner* — Henry Choe
(74) *Attorney, Agent, or Firm* — Schwegman Lundberg & Woessner, P.A.

(57) ABSTRACT

A capacitive amplifier device and technique for mitigating the perturbation within the switchable terminals of a feedback capacitor which is produced by the switching activity performed as part of the device's operation. The capacitive amplifier contains feedback components which can be switched without producing significant kickback or poorly behaved transitions due to the inclusion of at least one dedicated circuit. The dedicated circuit is a kickback limiter circuitry which is connected to a switchable node and is designed to reduce the kickback. The technique for reducing the kickback produced can be achieved by connecting and activating the kickback limiter circuitry.

20 Claims, 6 Drawing Sheets

(56) References Cited

U.S. PATENT DOCUMENTS

| | | |
|---|---|---|
| 9,615,744 B2 | 4/2017 | Denison et al. |
| 9,621,120 B2 | 4/2017 | Mora-puchalt |
| 9,692,444 B1 | 6/2017 | Das et al. |
| 10,158,334 B2 | 12/2018 | Wang et al. |
| 10,187,026 B2 | 1/2019 | Zamprogno et al. |
| 10,630,245 B2 | 4/2020 | Trifonov et al. |
| 10,637,453 B2 | 4/2020 | Dai |
| 10,756,748 B1 | 8/2020 | Khatavkar et al. |
| 11,043,957 B2 | 6/2021 | Nakamoto |

* cited by examiner

CAPACITIVE AMPLIFIER WITH LOW KICKBACK FROM SWITCHABLE FEEDBACK CAPACITORS

FIELD OF THE DISCLOSURE

This document pertains generally to capacitive amplifiers.

BACKGROUND

The capacitive amplifier is a versatile building block for analog signal processing. However, when switching feedback capacitors around amplifiers, particularly in the case of capacitive amplifiers performing a pre-charge phase, perturbations within the switchable terminals of the capacitors may occur. These perturbations may negatively impact the subsequent transient when reconnecting the feedback capacitor and may produce a kickback into the circuitry connected to the amplifier's input.

SUMMARY OF THE DISCLOSURE

This disclosure is directed to, among other things, a capacitive amplifier device and technique for mitigating the perturbation within the switchable terminals of a feedback capacitor that is produced by the switching activity performed as part of the device's operation. Described are specific solutions to reducing the perturbations that may negatively impact the subsequent transient when reconnecting the feedback capacitor. Reducing the kickback into the circuitry connected to the amplifier's input can be achieved by connecting kickback limiter circuitry to a switchable node of the capacitive amplifier. The technique for reducing the kickback produced can be achieved by connecting and activating the kickback limiter circuitry to the capacitive amplifier.

In some aspects, this disclosure is directed to capacitive amplifier circuitry with a switchable first feedback network, the capacitive amplifier circuitry including a first amplifier circuit stage having a first amplifier stage first output and a second amplifier circuit stage, coupled to the first amplifier stage first output, having a second amplifier stage first output, the capacitive amplifier circuitry comprising: a first switchable node, coupled to a switchable first feedback component by a first switch controlled by a first clock signal and in a first capacitive feedback path between the second amplifier circuit stage and the first amplifier circuit stage; and a first kickback limiter circuitry, coupled to the first switchable node and configured to reduce a kickback produced by a first output switch.

In some aspects, this disclosure is directed to a method of reducing a kickback produced by switching an output stage of a capacitive amplifier circuitry, the capacitive amplifier circuitry including a first amplifier circuit stage having a first amplifier stage first output and a second amplifier circuit stage, coupled to the first amplifier stage first output, having a second amplifier stage first output, the method comprising: connecting a first kickback limiter circuitry to a first switchable node in a first feedback path of the capacitive amplifier circuitry; synchronizing the first kickback limiter circuitry with the activity of a first output switch; and holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry.

In some aspects, this disclosure is directed to capacitive amplifier circuitry with a switchable first feedback network, the capacitive amplifier circuitry including a first amplifier circuit stage having a first amplifier stage first output and a second amplifier circuit stage, coupled to the first amplifier stage first output, having a second amplifier stage first output, the capacitive amplifier circuitry comprising: means for connecting a first kickback limiter circuitry to a first switchable node in a first feedback path of the capacitive amplifier circuitry; means for synchronizing the first kickback limiter circuitry with an activity of a first output switch; and means for holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

The capacitive amplifier is a versatile building block for analog signal processing. However, when switching feedback capacitors around amplifiers, particularly in the case of capacitive amplifiers performing a pre-charge phase, perturbations within the switchable terminals of the capacitors may occur. Some approaches can limit the potential kickback from the load activity into the circuitry preceding the output stage of a capacitive amplifier. The present inventors have recognized that a need for improvement upon the switching of the output stage in capacitive amplifiers to reduce the associated kickback for sensitive applications still exists.

This disclosure describes, among other things, a capacitive amplifier device and technique for mitigating the perturbation within the switchable terminals of a feedback capacitor, which is produced by the switching activity performed as part of the device's operation. Connecting kickback limiter circuitry to a switchable node of the capacitive amplifier may reduce the kickback into the circuitry connected to the amplifier's input.

Figure 1:
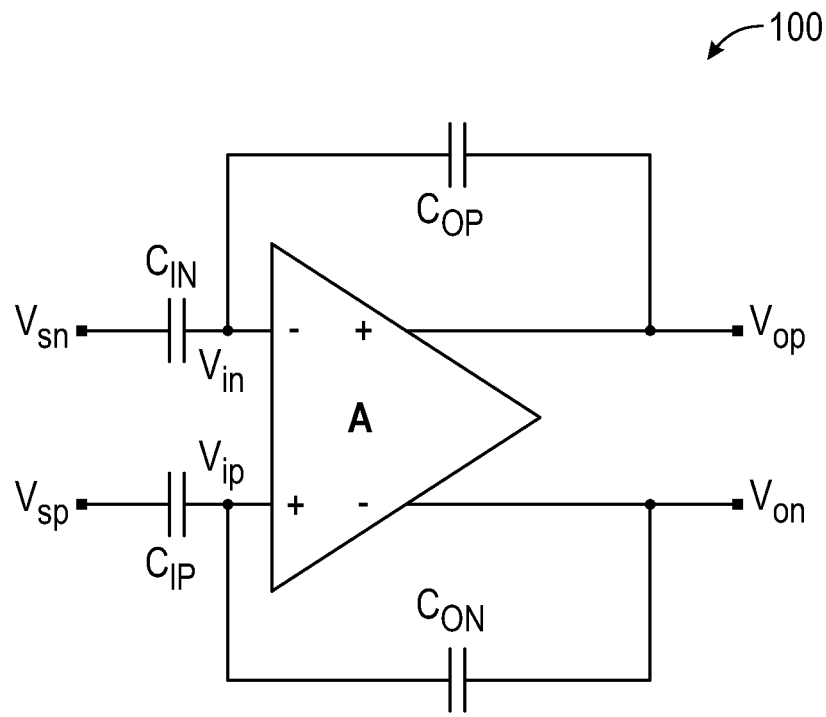
FIG. 1 is an example of a fully differential capacitive amplifier.

FIG. 1 is an example of a fully differential capacitive amplifier 100. The capacitive amplifier 100 of FIG. 1 may be formed by an amplifier A operating in a negative feedback configuration through feedback capacitors $C_{OP}$, $C_{ON}$ connecting the outputs $V_{op}$, $V_{on}$ of A to its inputs $V_{in}$, $V_{ip}$. A signal source $V_{sp}$, $V_{sn}$ is interfaced to the input of A by input capacitors $C_{IP}$, $C_{IN}$. Nominally, the symmetrical capacitors are matched ($C_{IP} \approx C_{IN} = C_I$, $C_{OP} \approx C_{ON} = C_O$).

The capacitive amplifier 100 thus formed may amplify, with a gain established by the capacitor ratio $C_I/C_O$, the Differential-Mode (DM) input source $V_{sd} = V_{sp} - V_{sn}$, while it rejects its Common-Mode (CM) component $V_{sc} = (V_{sp} + V_{sn})/2$. Therefore, the ideal differential output $V_{od} = V_{op} - V_{on}$ of A is given by $V_{od} = (C_I/C_O) \cdot V_{sd}$.

Such transfer function would not be valid for low enough frequencies of $V_{sd}$ since no signal would be conveyed by the input capacitors $C_{IP}$, $C_{IN}$; however, the capacitive amplifier of FIG. 1 can be adapted to accept low frequency signals. Both the CM output $V_{oc} = (V_{op} + V_{on})/2$ and CM input $V_{ic} = (V_{ip} + V_{in})/2$ of A are poorly defined. Consequently, dedicated techniques (not represented in FIG. 1) are introduced to regulate the CM voltages $V_{oc}$ and $V_{ic}$.

If the load driven by the capacitive amplifier is resistive (implying a DC loading), or otherwise demanding such a Switched-Capacitor (SC) load, the amplifier A may be implemented by using a 2-stage amplifier in such a way that the input stage is optimized for accuracy (or other criteria) while the output stage may be optimized for driving the load. Multiple versions exist in the literature, and additional intermediate stages for the implementation of A could be considered.

In the case of demanding capacitive loads, a technique to alleviate the driving capability of the capacitive amplifier is to perform a pre-charge of the load to the estimated output $V_{op}$, $V_{on}$ values in such a way that the capacitive amplifier drives the load to its fine settling. This is particularly applicable in the context of Discrete-Time (DT) implementations.

Furthermore, the activity in the load as part of its normal operation can perturb the capacitive amplifier and/or the circuitry connected at its input, potentially jeopardizing the performance (an effect known as kickback). In such a case, one may apply techniques to prevent such perturbations from affecting the capacitive amplifier. This consideration becomes particularly relevant when the capacitive amplifier drives multiplexed channels, chopped signal chains and/or Switched Capacitor (SC) front-ends, like the sampling stage of an Analog-to-Digital Converter (ADC).

In the case of a multiple stage amplifier A, the capacitive amplifier accepts a modification to efficiently provide both the pre-charge and the perturbation blocking function.

Figure 2:
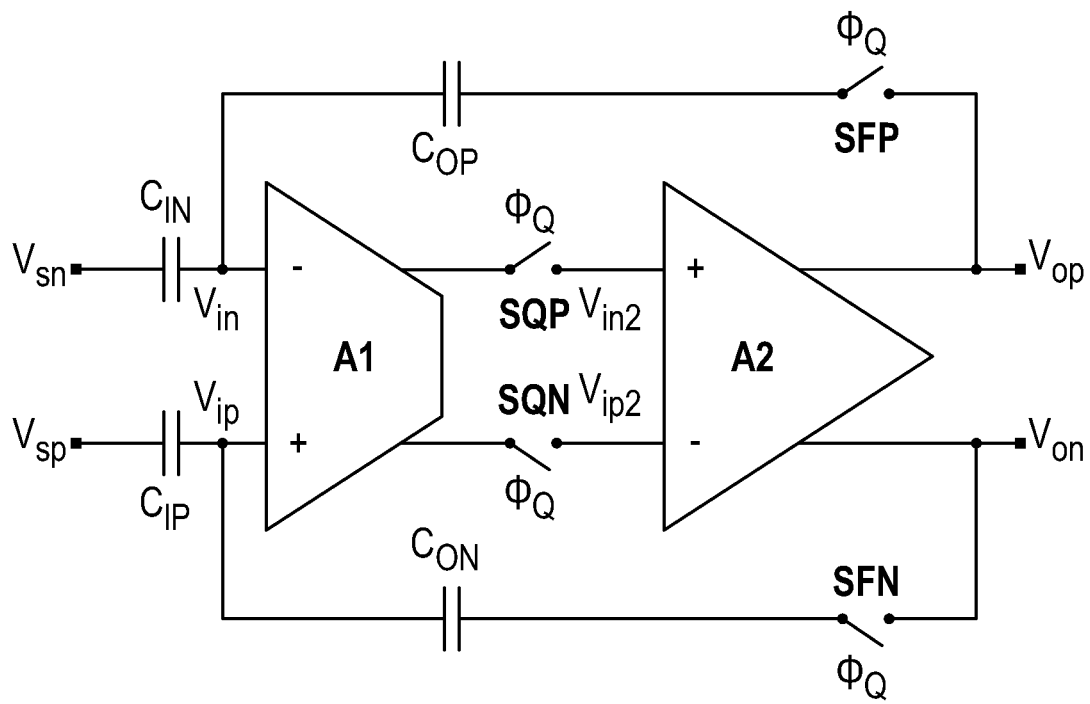
FIG. 2 is an example of a two-stage fully differential capacitive amplifier with pre-charge by its output stage.

FIG. 2 is an example of a two-stage fully differential capacitive amplifier with pre-charge by its output stage. The capacitive amplifier 200 of FIG. 2, (similar to the one described in connection with FIG. 1) may be formed by two amplifier stages A1 and A2 explicitly shown. The input of amplifier circuit A2 is a function of the output of the amplifier circuit A1 when switches SQP, SQN between both stages are closed. A set of switches SFP, SFN may disconnect the feedback capacitors $C_{OP}$, $C_{ON}$ from the capacitive amplifier output $V_{op}$, $V_{on}$ (and, thus, the load) when opened.

The described switches may be controlled by a clock signal, normally synchronized with the load activity. When the switches are closed, the capacitive amplifier 200 is configured in normal amplification mode and, when the switches are opened, the capacitive amplifier 200 is configured in a pre-charge mode in which the amplifier circuit A2 performs (in open-loop) the pre-charge of the load to the value already available at the capacitive amplifier output (normally, a coarse version of the final output value to be forced to the load during the subsequent amplification phase). Those switches are often advantageously, implemented by Field-Effect-Transistor (FET) technology and, thus, subject to the drawback of charge injection during their transitions.

The fact that amplifier circuit A2 is totally disconnected from the rest of the capacitive amplifier 200 (including from the feedback capacitors) during the interval that exhibits more load activity may mitigate the possible kickback of the load into the capacitive amplifier stages preceding the amplifier circuit A2 and the circuitry connected to its input (which may be a sensitive input source). As a result, an effective blocking of the load perturbation is provided by this approach sparing the need for more sophisticated and/or expensive techniques (as the use of a dedicated buffer between the capacitive amplifier and the load).

Therefore, the technique represented in FIG. 2 may efficiently allow a pre-charge of the load (thus alleviating the capacitive amplifier dynamics when driving demanding loads) while limiting the potential kickback from the load activity into the circuitry preceding the output stage of the capacitive amplifier. The kickback limiting function is particularly relevant if the capacitive amplifier (once configured back to amplification mode) and/or the circuitry connected to its input (like a signal conditioning or pre-amplification stage) is bandwidth limited (possibly, to boost the noise performance). This is because a given perturbation may take too long to settle in a bandwidth limited signal chain, thus jeopardizing the overall performance.

In such cases, where the circuitry to be protected from the perturbations caused by the load activity is especially sensitive, one may isolate such circuitry from the capacitive amplifier pre-charge phase transitions to prevent the corresponding residual kickback. In particular, the pedestal error induced by the charge injection caused by the switching of SFP and SFN (see FIG. 2) at the corresponding terminals of the feedback capacitors, may impact the dynamic performance.

Therefore, the need for improving the switching of the output stage in capacitive amplifiers (possibly, as part of a pre-charge scheme) to reduce the associated kickback exists for sensitive applications.

Figure 3:
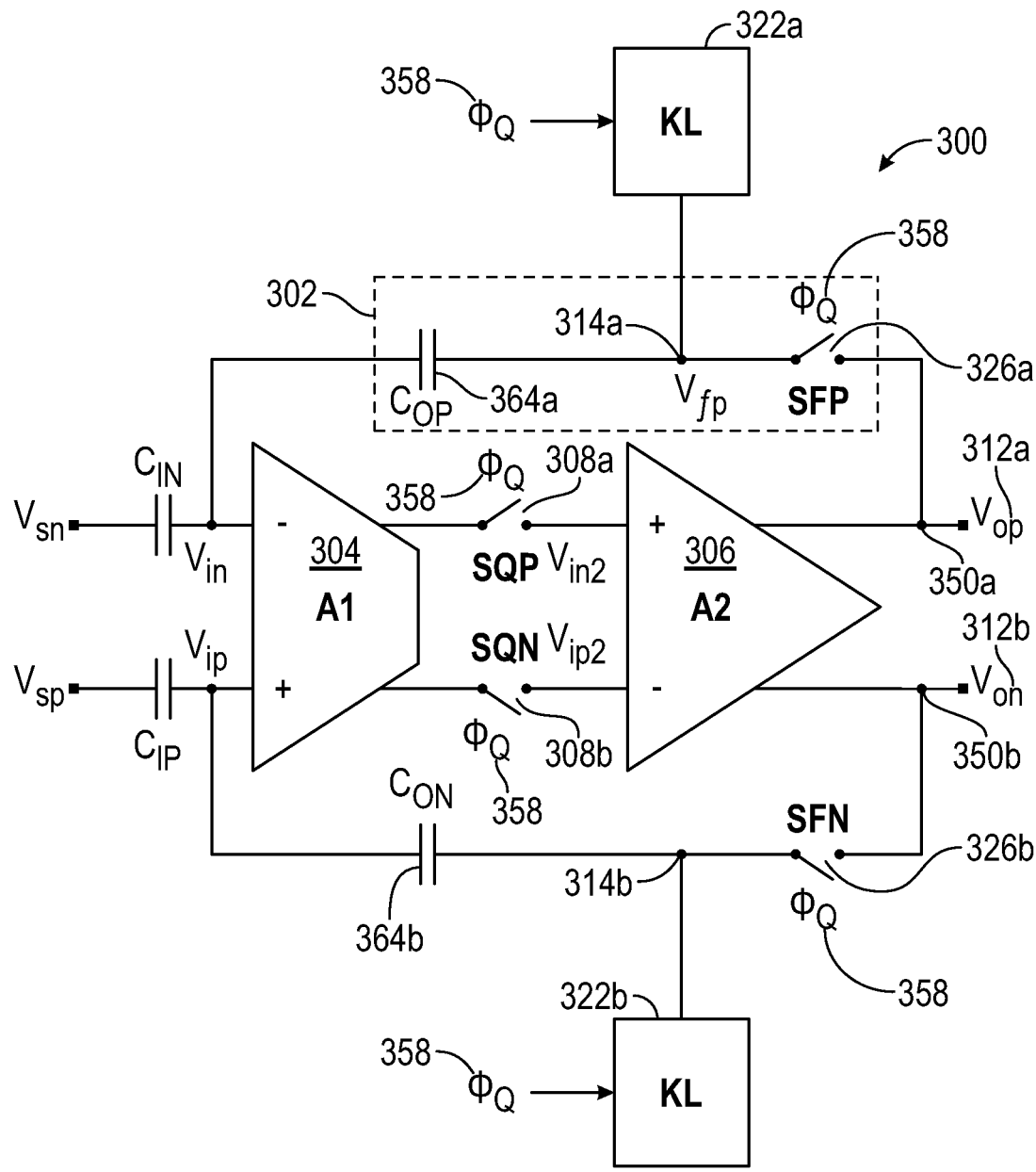
FIG. 3 is an example of a two-stage fully differential capacitive amplifier with pre-charge by its output stage and two kickback limiter amplifier circuits.

FIG. 3 is an example of a two-stage fully differential capacitive amplifier with pre-charge by its output stage and two kickback limiter amplifier circuits. The kickback produced by the switching of the output stage of capacitive amplifier circuitry 300 can be minimized if the switchable terminals of the feedback capacitors are kept unperturbed during the process. In other words, if the voltage at the relevant terminals is held to the value they presented before the switching of the output stage, then this operation will tend to be transparent to the preceding circuitry and, as a result, the potential kickback may be mitigated. Such an approach is illustrated in FIG. 3.

The capacitive amplifier circuitry 300 of FIG. 3 may include both a first amplifier circuit stage 304 and a second amplifier circuit stage 306 as differential amplifier circuits. The first amplifier circuit stage 304 includes the first amplifier stage first output 308a that connects to a first input of the second amplifier circuit stage 306 and a first amplifier stage second output 308b that connects to a second input of the second amplifier circuit stage 306. The second amplifier circuit stage 306 includes the second amplifier stage first output 350a that also is a first output 312a of the capacitive amplifier 300 and a second amplifier stage second output 350b that also is a second output 312b of the capacitive amplifier 300.

The capacitive amplifier circuitry 300 also includes a first switchable node 314a which is connected to a switchable first feedback component 364a by a switching element 326a controlled by a first clock signal 358 and is in a first capacitive feedback path between the first capacitive amplifier output 350a and a first input of the first amplifier circuit stage 304.

Additionally, the capacitive amplifier circuitry 300 includes a second switchable node 314b. The second switchable node 314b is connected to a switchable second feedback component 364b by a switching element 326b controlled by a first clock signal 358 and is in a second capacitive feedback path between the second capacitive amplifier output 350b and a second input of the first amplifier circuit stage 304.

The feedback components 364a and 364b of the capacitive amplifier circuitry 300 can be any passive network equivalent to a capacitance.

In the capacitive amplifier circuitry 300, a first kickback limiter circuitry 322a is connected to the first switchable node 314a, and a second kickback limiter circuitry 322b is connected to the second switchable node 314b.

The first and second kickback limiter circuitries 322a and 322b conceptualizes the function of holding the voltage level at the switchable nodes 314a and 314b, respectively, during the switching of the second amplifier circuit stage 306.

The first and second kickback limiter circuitries 322a, 322b address the perturbation caused by the charge injection of first and second output switches 326a, 326b including the possible pedestal error induced in the capacitive feedback components 364a, 364b, produced when first and second output switches 326a, 326b open as part of the reconfiguration of the second amplifier circuit stage 306 for the pre-charge phase (or pre-charge mode). Therefore, the first and second kickback limiter circuitries 322a, 322b may be synchronized with the switching of the second amplifier circuit stage 306 which, in turn, may be synchronized in general with the activity in the load. Therefore, conceptually, first and second kickback limiter circuitries 322a, 322b are driven by the first clock signal $\phi_Q$ 358 that controls the pre-charge.

Figure 4:
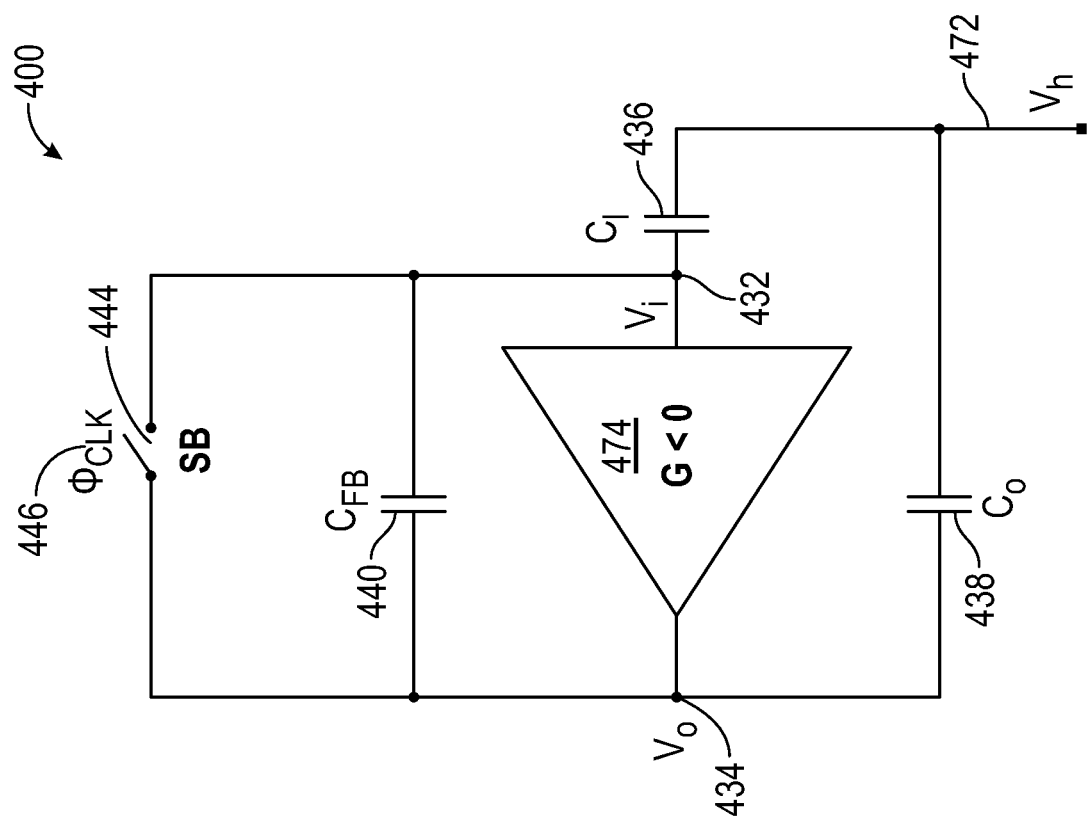
FIG. 4 is an example of a kickback limiter amplifier circuit.

A particularly convenient implementation of the first and second kickback limiter circuitries 322a, 322b, whose functions are to hold the voltage at the first and second switchable nodes 314a, 314b connected to them, is based on a single ended amplifier strategically set to operate in a closed feedback loop configuration, as shown in FIG. 4.

FIG. 4 is an example of first and second kickback limiter circuitries 322a, 322b that can be used to implement various techniques of this disclosure. In the example shown in FIG. 4, a single-ended amplifier 474, whose open-loop gain is negative (G<0) and its input impedance is high, is configured in a closed feedback loop by a first kickback limiter feedback component 440 between its first kickback limiter amplifier input 432 and first kickback limiter amplifier output 434. Both the first kickback limiter amplifier input 432 and first kickback limiter amplifier output 434 are connected to the node $V_h$ 472, whose voltage is to be held, through the first kickback limiter input capacitor 436 and the first kickback limiter output capacitor 438, respectively. In some examples, the capacitive loading produced by the first kickback limiter circuitry upon the first switchable node 314 is dominated by respective capacitance values of the first kickback limited input capacitor 436 and the first kickback limited output capacitor 438 of the kickback limiter circuitry 400.

Moreover, a first kickback limiter switch 444 is controlled by a second clock signal 446 which periodically shorts the first kickback limiter amplifier input 432 with the first kickback limiter amplifier output 434 to bias the first kickback limiter amplifier input 432. The second clock signal 446 will be, in general, synchronized with the perturbation at node $V_h$ 472 that the first and second kickback limiter circuitries 322a, 322b mitigate. In relation to FIG. 3, the second clock signal 446 may be a function of the first clock signal 358 that controls the pre-charge of the capacitive amplifier circuitry 300. Both the first clock signal 358 and second clock signal 446 may match and the first and second kickback limiter circuitries 322a, 322b may accept the first clock signal 358 as its clock signal (as shown in FIG. 3), or a (slightly) delayed version of the first clock signal 358 may be used to drive the first and second kickback limiter circuitries 322a, 322b.

The transfer function of the kickback limiter circuitry 400, at the frequencies of interest, is given by:

$$V_o = \frac{G \cdot C_I}{C_I + C_{FB} - G \cdot C_{FB}} \cdot V_h \qquad \text{(Eq. 1)}$$

where G is the open-loop gain, $C_I$ is the capacitance of the capacitor coupled to its input, $C_{FB}$ is a capacitance of a feedback capacitor between the input $V_i$ 432 and the output $V_o$ 434 of the amplifier 474.

If |C|>>1, Eq. 1 approaches the following expression:

$$V_o \approx -\frac{C_I}{C_{FB}} \cdot V_h \qquad \text{(Eq. 2)}$$

On the other hand, the value of node $V_h$ 472 as a function of the changes in the first kickback limiter amplifier input 432 and the first kickback limiter amplifier output 434 is given by:

$$V_h = \frac{C_I \cdot V_i + C_O \cdot V_o}{C_I + C_O} \qquad \text{(Eq. 3)}$$

where $C_O$ is the capacitance of the capacitor coupled to the output 434 of the amplifier 474.

Therefore, a given perturbation $\Delta V_p$ in node $V_h$ 472 caused by the capacitive amplifier circuitry 300 may produce at the first kickback limiter amplifier output 434 of amplifier 474 a change quantifiable as (assuming |G|>>1 and applying Eq. 2):

$$\Delta V_o|_P \approx -\frac{C_I}{C_{FB}} \cdot \Delta V_p \qquad \text{(Eq. 4)}$$

In turn, the final change $\Delta V_h$ in node $V_h$ 472 as the result of the variation in the first kickback limiter amplifier input 432 and first kickback limiter amplifier output 434 due to the action of the kickback limiter circuitry 400 in response of perturbation $\Delta V_p$ can be expressed, substituting Eq. 4 into Eq. 3, as (where $\Delta V_i$ is the change experienced by the first kickback limiter amplifier input 432 as the result of the operation of the kickback limiter circuitry):

$$\Delta V_h = \frac{C_I \cdot \Delta V_i + C_O \cdot \Delta V_o|_P}{C_I + C_O} = \frac{C_I \cdot \Delta V_i - C_O \cdot \frac{C_I}{C_{FB}} \cdot \Delta V_p}{C_I + C_O} \quad \text{(Eq. 5)}$$

Equation 5 implies that, for the perturbation $\Delta V_p$ to be rejected by the kickback limiter circuitry 400 and, hence, the original voltage at $V_h$ 472 to be held, compensating the initial change $\Delta V_p$, the following condition applies:

$$\Delta V_h = -\Delta V_p \rightarrow \frac{\Delta V_i}{\Delta V_p} = \frac{C_O}{C_{FB}} - \frac{C_O}{C_I} - 1 \quad \text{(Eq. 6)}$$

As a result, a predictable perturbation $\Delta V_p$ in node $V_h$ 472 can be nominally canceled by properly sizing the capacitor ratios $C_O/C_{FB}$, $C_O/C_I$ and the size of perturbation $\Delta V_i$ in the first kickback limiter amplifier input 432. The perturbation $\Delta V_i$ will be dominated (given that $|C| \gg 1$) by the charge injection into the first kickback limiter amplifier input 432 by the opening of the first kickback limiter switch 444 as shown in FIG. 4.

The design parameters of the first kickback limiter input capacitor 436, namely the first kickback limiter output capacitor 438, the first kickback limiter feedback component 440, and $\Delta V_i$ can be adjusted, following Eq. 6, to cancel a given perturbation $\Delta V_p$. Deviation on the nominal value of those parameters may cause a residual error in the perturbation cancellation, but the negative feedback around the amplifier 474 allows the perturbation cancellation to be predictable and robust against variability (as long as $|G| \gg 1$). Thus, the effect of the perturbation may be reduced by orders of magnitude by the action of the kickback limiter circuitry 400.

Amplifier 474 of the kickback limiter circuitry 400 does not have demanding static or dynamic requirements (other than having a high input impedance, $G < 0$ and $|G| \gg 1$). Hence, the implementation of amplifier 474 can be simple and, thus, inexpensive, making the examples of the kickback limiter circuitry 400 competitive. One example of a configuration may include a complementary inverting amplifier, such as an FET inverting amplifier.

In some examples, the kickback limiter amplifier 474 may exhibit an input impedance higher than the one implied by its external loading in such a way that it can hold a voltage level in its input.

Regarding the first kickback limiter switch 444, any suitable topology can be applied and, optionally, a relation between the first kickback limiter switch 444 and the first and second output switches 326a, 326b causing the perturbation in node $V_h$ 472 to be held can be considered for a better tracking of the ratio $\Delta V_i/\Delta V_p$ in Eq. 6.

Figure 5:
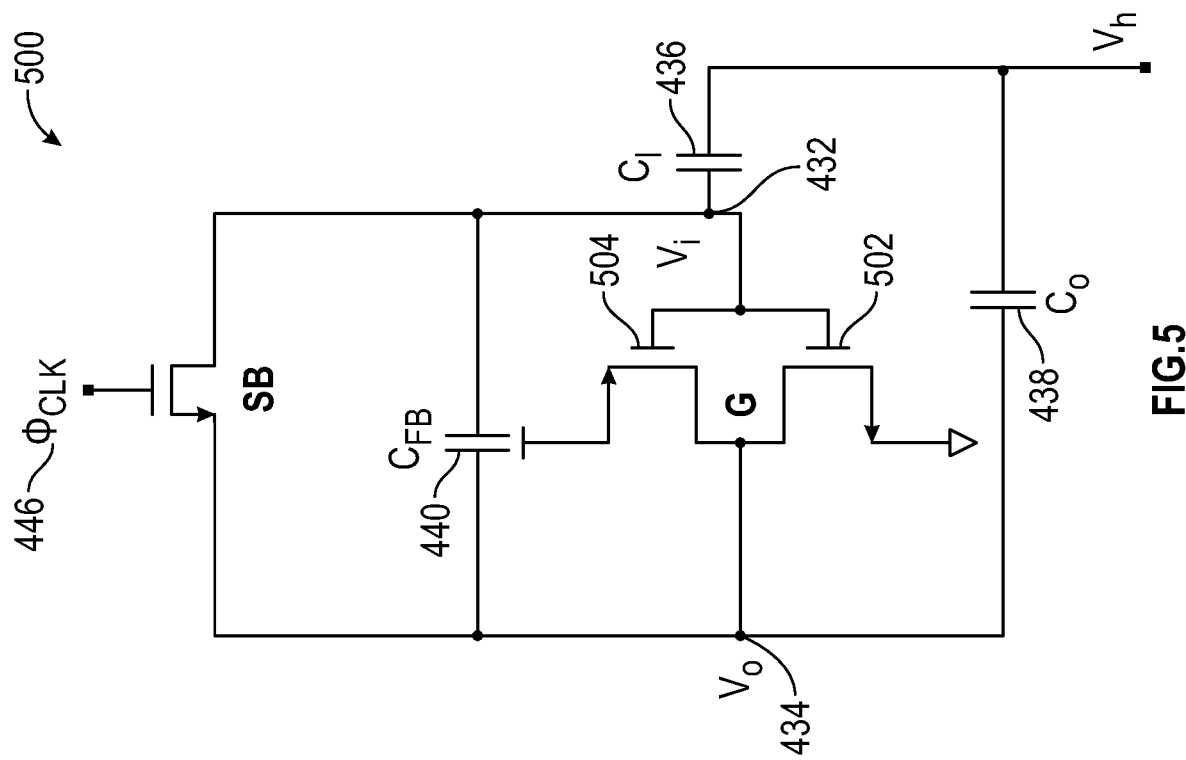
FIG. 5 is another example of a kickback limiter amplifier circuit.

An example of such a topology is illustrated by FIG. 5, which shows an example configuration of the first and second kickback limiter circuitries 322a, 322b.

FIG. 5 is another example of a kickback limiter amplifier circuit 500 that can be used to implement various techniques of this disclosure. For the first kickback limiter switch 444, an N-type FET, e.g., an NMOS transistor, is shown but other switch typologies (such as a transmission gate configuration) may be equally applied by adapting properly the first and second clock signals 358, 446.

In connection with the capacitive amplifier circuitry 300 of FIG. 3, the use of the first and second kickback limiter circuitries 322a, 322b described above with respect to FIG. 4 may use the pre-charge first clock signal 358 (or a close version of it) as the second clock signal 446 of the first and second kickback limiter circuitries 322a, 322b (in such a way that, when the pre-charge perturbation is to be canceled, the first kickback limiter switch 444 opens to allow the amplifier 474 operation), and to connect the node $V_h$ 472 to be held by the first and second kickback limiter circuitries 322a, 322b to the corresponding first and second switchable nodes 314a, 314b of the switchable first and second feedback components 364a, 364b to cancel the perturbation caused by the first and second output switches 326a, 326b.

Figure 6:
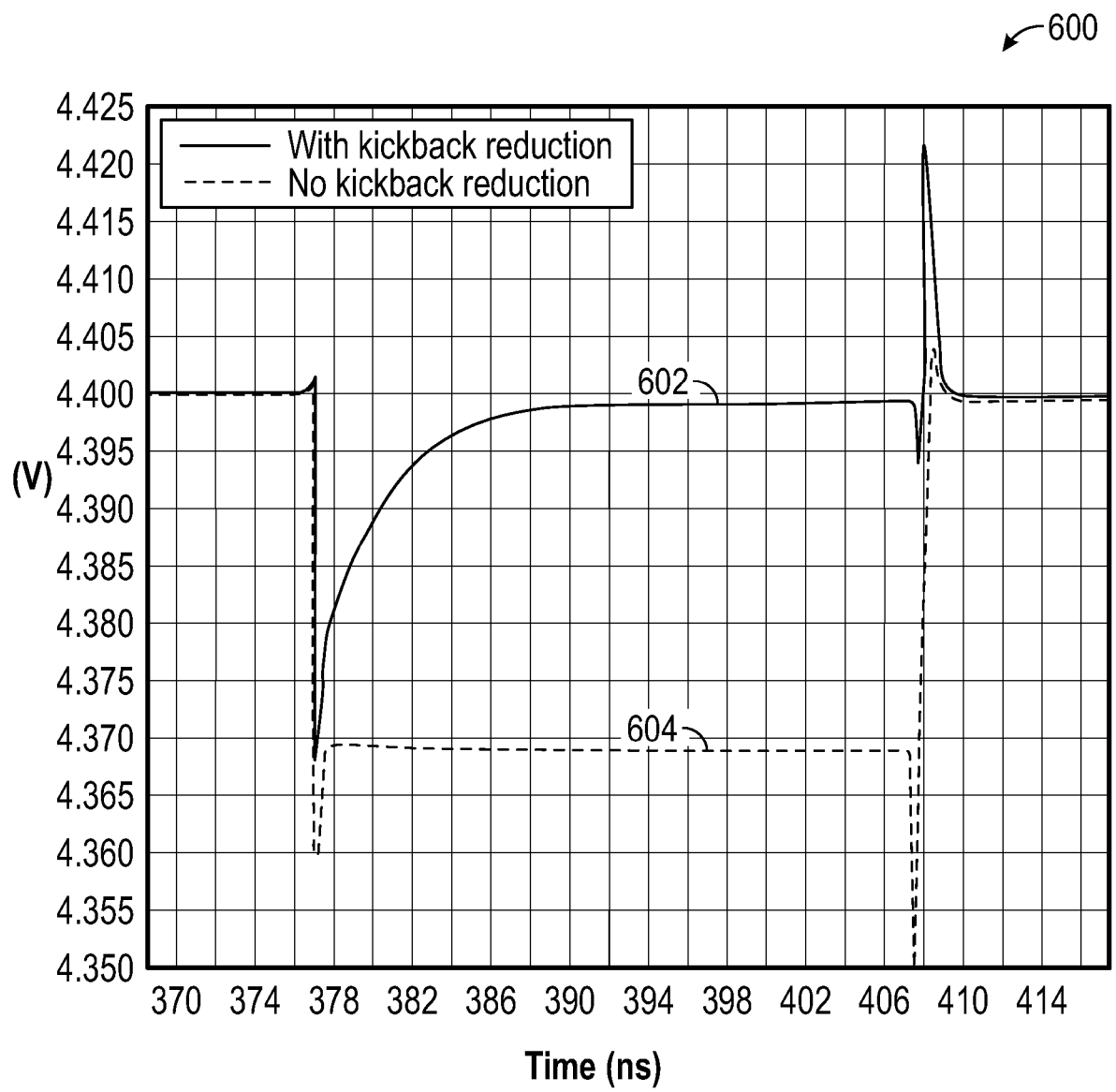
FIG. 6 is a graph depicting a transient simulation of pre-charge perturbation of a capacitive amplifier.

FIG. 6 is a graph 600 depicting a transient simulation of pre-charge perturbation of a capacitive amplifier. The x-axis represents time (in nanoseconds), and the y-axis represents voltage (in volts). The graph 600 compares kickback reduction, shown at 602, to no kickback reduction, shown at 604.

FIG. 6 shows, by way of illustration, a simulated perturbation 602 in a capacitive amplifier equivalent to the one shown in FIG. 3 that includes first and second kickback limiter circuitries 322a, 322b in line with the configuration shown in FIG. 5. Comparing the settled shift in the voltage of the relevant terminal of the switchable first and second feedback components 364a, 364b with the kickback limiting function enabled and disabled, it is observed that the significant intrinsic pedestal error (that potentially jeopardizes the dynamics of bandwidth limited blocks in the signal chain) present when the first and second kickback limiter circuitries 322a, 322b are not engaged is reduced to a negligible residual error by the action of the first and second kickback limiter circuitries 322a, 322b. Such improvement extends over the variability of operational conditions, indicating the robustness of the concept.

The approach shown in FIG. 3 may efficiently enable the switching of the switchable first and second feedback components 364a, 364b in the capacitive amplifier circuitry 300 without causing a perturbation at corresponding first and second switchable nodes 314a, 314b that could jeopardize the dynamics of the capacitive amplifier circuitry 300 or the blocks around it. In particular, this spares the need for a relatively high bandwidth in the signal chain to recover fast enough from said perturbation, thus alleviating the tradeoff between noise and settling time by allowing a strategically low bandwidth in the signal chain to boost the noise performance without jeopardizing the overall settling time.

Figure 7:
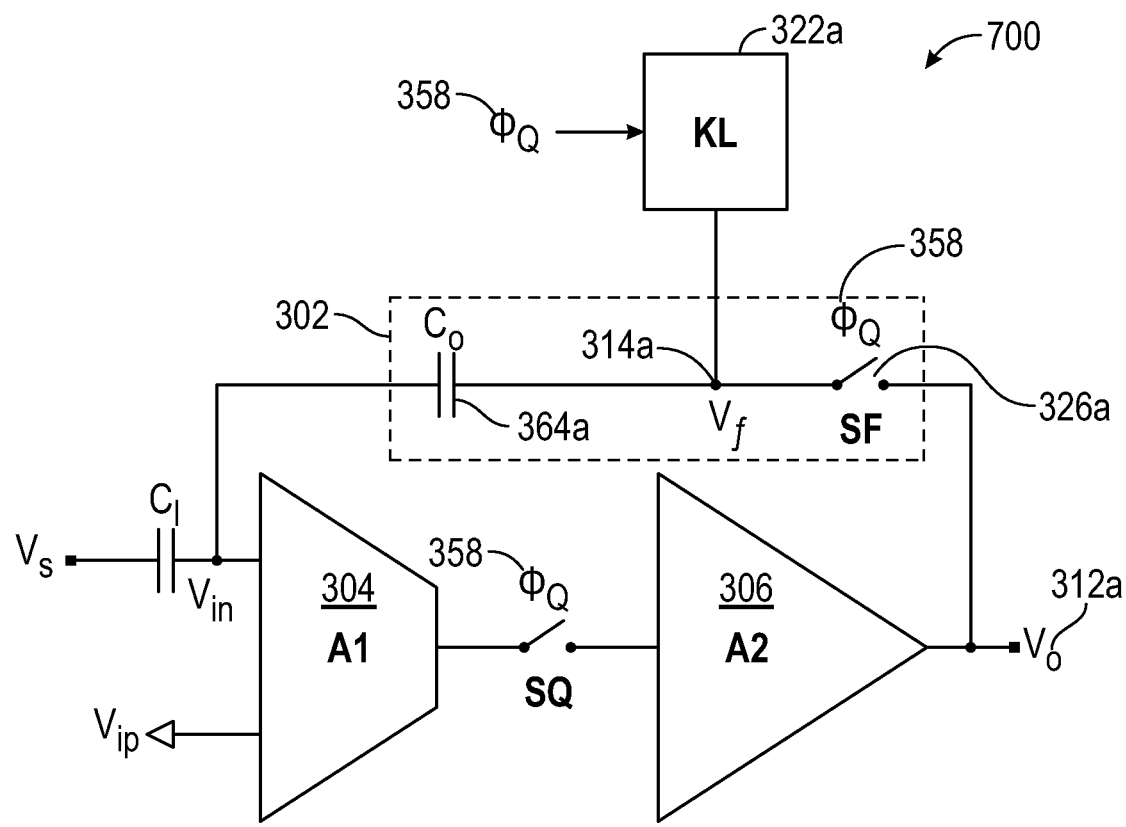
FIG. 7 is an example of a single-ended capacitive amplifier with pre-charge and a single kickback limiter amplifier circuit.

Although the techniques above have been described in the context of fully differential capacitive amplifiers, the techniques are applicable to single-ended configurations because the concept does not rely on the differential nature of the perturbation to be blocked. FIG. 7 illustrates the application of the disclosed techniques to a single-ended arrangement.

FIG. 7 is an example of a single-ended capacitive amplifier 700 with pre-charge and a first kickback limiter circuitry 322a. The single-ended capacitive amplifier circuitry 700 with switchable first feedback network 302 of FIG. 7 may include a first amplifier circuit stage 304 and a second amplifier circuit stage 306.

Like in FIG. 3, the kickback produced by the switching of the output stage of capacitive amplifier circuitry 700 in FIG. 7 can be minimized if the switchable terminals of the feedback capacitor is kept unperturbed during the process. In other words, if the voltage at the relevant terminal is held to the value it presented before the switching of the output stage, then this operation will tend to be transparent to the preceding circuitry and, as a result, the potential kickback may be mitigated.

The first amplifier circuit stage 304 includes a first amplifier stage output that connects to an input of the second amplifier circuit stage 306. The second amplifier circuit stage 306 includes a second amplifier stage output that also is an output 312a of the capacitive amplifier 700.

The capacitive amplifier circuitry 700 also includes a switchable node 314a which is connected to a switchable feedback component 364a by a switching element 326a controlled by a clock signal 358 and is in a capacitive feedback path between the output of the second amplifier circuit stage 306 and an input of the first amplifier circuit stage 304. The feedback component 364a of the capacitive amplifier circuitry 700 can be any passive network equivalent to a capacitance.

In the capacitive amplifier circuitry 700, the kickback limiter circuitry 322a is connected to the switchable node 314a. The kickback limiter circuitry 322a conceptualizes the function of holding the voltage level at the switchable node 314a during the switching of the second amplifier circuit stage 306. The kickback limiter circuitry 322a addresses the perturbation caused by the charge injection of the output switches 326a, including the possible pedestal error induced in the capacitive feedback component 364a that may be produced when the output switch 326a opens as part of the reconfiguration of the second amplifier circuit stage 306 for the pre-charge phase (or pre-charge mode). Therefore, the kickback limiter circuitry 322a may be synchronized with the switching of the second amplifier circuit stage 306 which, in turn, may be synchronized in general with the activity in the load. Therefore, conceptually, the kickback limiter circuitry 322a is driven by the clock signal $\phi_Q$ 358 that controls the pre-charge. An example of the kickback limiter circuitry 322a is described above with respect to FIG. 4.

In addition, the techniques of this disclosure do not assume any specific topology for the capacitive amplifier circuitry of FIG. 3 or 7, or the first and second amplifier circuit stages 304, 306. For the type of pre-charge discussed in connection with FIG. 2, the capacitive amplifier circuitry may have at least two stages. However, in general, the techniques of this disclosure are applicable to any capacitive amplifier whose feedback capacitors are periodically switched. The capacitive amplifier circuitry of FIG. 3 or 7 may be a standalone circuit or form part of a more complex signal chain. In that sense, it may be driving, the overall load or an intermediate node whose dynamics are relevant. Though the focus has been on capacitive loads, the driving of any demanding load, irrespective of its nature, may benefit from the presented concept.

Figure 8:
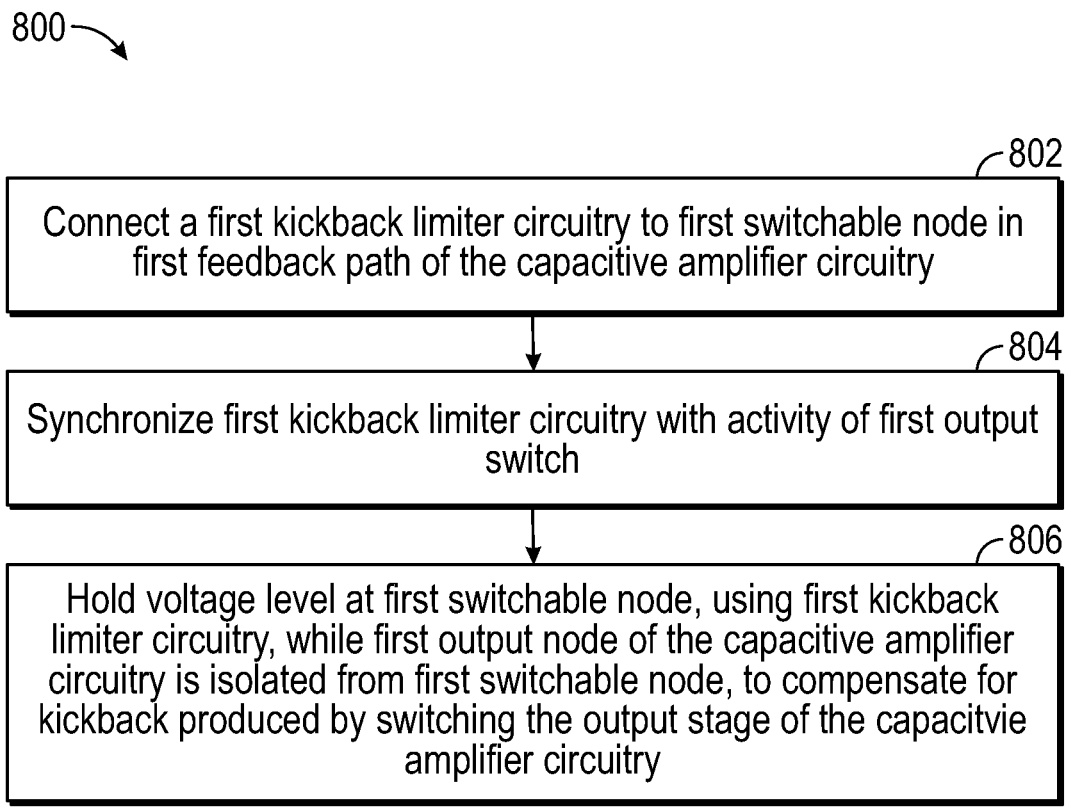
FIG. 8 is a flow diagram illustrating an example of a method of reducing kickback produced by switching an output stage of capacitive amplifier circuitry.

FIG. 8 is a flow diagram illustrating an example of a method 800 of reducing a kickback produced by switching an output stage of a capacitive amplifier circuitry, the capacitive amplifier circuitry including a first amplifier circuit stage having a first amplifier stage first output and a second amplifier circuit stage, coupled to the first amplifier stage first output, having a second amplifier stage first output.

At block 802, the method 800 can include connecting a first kickback limiter circuitry 322a to a first switchable node 314a in a first feedback path of the capacitive amplifier circuitry 300.

At block 804, the method 800 can include synchronizing the first kickback limiter circuitry 322a with an activity of a first output switch.

At block 806, the method 800 can include holding a voltage level at the first switchable node 314a, using the first kickback limiter circuitry 322a, while a first output node 350a of the capacitive amplifier circuitry 300 is isolated from the first switchable node 314a, to compensate for the kickback produced by switching the output stage of the capacitive amplifier circuitry.

In some examples, holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry may include using negative feedback around the first kickback limiter.

In some examples, the method 800 can include connecting a first kickback limiter switch in parallel with the first kickback limiter feedback component, and controlling the first kickback limiter switch by a second clock signal that (1) closes periodically to bias a first kickback limiter amplifier input and (2) opens periodically to inject a charge associated with opening the first kickback limiter switch onto the first kickback limiter amplifier input.

The techniques of this disclosure may be adapted to any capacitive feedback structure (possibly, including several capacitive and switching elements) by allocating a kickback limiter circuitry 400 to hold the corresponding switchable nodes 314a or 314b. Also, the switchable nodes 314a, 314b of the switchable first feedback components 364a, 364b for which the technique may be applied may be different from, or in addition to, the ones connecting towards the output of the capacitive amplifier.

Moreover, this application focuses on blocking the corresponding perturbation the switchable nodes 314a, 314b of the switchable feedback components 364a, 364b. In general, in addition to protecting such switchable nodes 314a, 314b, other switchable nodes in the capacitive amplifier circuitry 300 could have their associated perturbation blocked by similar techniques. For instance, in FIG. 3, the perturbation caused by switches SQP and SON into the output nodes of the first amplifier circuit stage 304 may be addressed by applying kickback limiter circuitries to the first and second capacitive amplifier outputs of the first amplifier circuit stage 304, in any case, the optional extension of the kickback limiting to other nodes does not depart from the techniques described above.

Although this disclosure has focused on the case of Integrated Circuits (IC), the various techniques are also applicable to discrete circuit configurations or any combination of the two.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. Capacitive amplifier circuitry with a switchable first feedback network, the capacitive amplifier circuitry including a first amplifier circuit stage having a first amplifier stage first output and a second amplifier circuit stage, coupled to the first amplifier stage first output, having a second amplifier stage first output, the capacitive amplifier circuitry comprising:
   a first switchable node, coupled to a switchable first feedback component by a first switch controlled by a first clock signal and in a first capacitive feedback path between the second amplifier circuit stage and the first amplifier circuit stage; and
   a first kickback limiter circuitry, coupled to the first switchable node and configured to reduce a kickback produced by a first output switch and configured to hold a voltage level at the first switchable node and configured to isolate from the first switchable node.

2. The capacitive amplifier circuitry of claim 1, wherein the first kickback limiter circuitry comprises:
   a first kickback limiter amplifier circuit, including a first kickback limiter amplifier input and a first kickback limiter amplifier output;
   a first kickback limiter input capacitor, connected between the first switchable node and the first kickback limiter amplifier input;
   a first kickback limiter output capacitor, connected between the first kickback limiter amplifier output and the first switchable node;
   a first kickback limiter feedback component, configured in a closed negative feedback loop from the first kickback limiter amplifier output to the first kickback limiter amplifier input; and
   a first kickback limiter switch, connected in parallel with the first kickback limiter feedback component, controlled by a second clock signal, the first kickback limiter switch configured (1) to be closed periodically to bias the first kickback limiter amplifier input and (2) to be opened periodically to inject a charge associated with opening the first kickback limiter switch onto the first kickback limiter amplifier input.

3. The capacitive amplifier circuitry of claim 2, wherein the first kickback limiter amplifier circuitry includes an inverting amplifier.

4. The capacitive amplifier circuitry of claim 2, wherein the first kickback limiter circuitry holds a voltage at the first switchable node, through the first kickback limiter input capacitor and the first kickback limiter output capacitor and by the action of the negative feedback around the first kickback limiter amplifier circuit, when the first output node of the second amplifier circuit stage is isolated from the first switchable node by the first output switch.

5. The capacitive amplifier circuitry of claim 2, wherein the first kickback limiter amplifier exhibits an input impedance higher than the one implied by its external loading in such a way that it can hold a voltage level in its input.

6. The capacitive amplifier circuitry of claim 2, wherein the second clock signal controlling the first kickback limiter switch is synchronized with the first clock signal controlling the first output switch.

7. The capacitive amplifier circuitry of claim 2, wherein the second clock signal is a function of the first clock signal, and wherein the first clock signal controls a pre-charge of the capacitive amplifier circuitry.

8. The capacitive amplifier circuitry of claim 2, wherein the first kickback limiter circuitry receives the second clock signal being the same as the first clock signal or a delayed version of the first clock signal.

9. The capacitive amplifier circuitry of claim 2, wherein a capacitive loading produced by the first kickback limiter circuitry upon the first switchable node is dominated by respective capacitance values of the first kickback limited input capacitor and the first kickback limited output capacitor of the first kickback limiter circuitry.

10. The capacitive amplifier circuitry of claim 2, wherein a capacitance value of at least one of the first kickback limiter feedback component, the first kickback limiter input capacitor, or the first kickback limiter output capacitor is trimmable, calibratable, programmable, or otherwise adjustable.

11. The capacitive amplifier circuitry of claim 1, wherein the first kickback limiter circuitry is controlled by the first clock signal to isolate a first output node of the second amplifier circuit stage from the first switchable node in the first capacitive feedback path.

12. The capacitive amplifier circuitry of claim 1, wherein the circuitry comprises a fully differential configuration, wherein the first amplifier circuit stage is a differential amplifier circuit, and the second amplifier circuit stage is a differential amplifier circuit, wherein:
the first amplifier circuit stage includes the first amplifier stage first output and a first amplifier stage second output;
the second amplifier circuit stage, coupled to the first amplifier stage, includes the second amplifier stage first output and a second amplifier stage second output;
the first switchable node coupled to the switchable first feedback component and in a first capacitive feedback path between the second amplifier circuit stage and the first amplifier circuit stage, and coupled to a first output node via a first output switch;
a second switchable node coupled to a switchable second feedback component and in a second capacitive feedback path between the second amplifier circuit stage and the first amplifier circuit stage, and coupled to a second output node via a second output switch; and
the first kickback limiter circuitry, connected to the first switchable node, and a second kickback limiter circuitry connected to the second switchable node, the first and second kickback limiter circuitries respectively configured to reduce the kickback produced by the first output switch and the second output switch, each controlled by a first clock signal, to isolate the first output node of the second amplifier circuit stage from the first switchable node in the first capacitive feedback path and to isolate the second output node of the second amplifier circuit stage from the second switchable node in the second capacitive feedback path.

13. The capacitive amplifier circuitry of claim 1, wherein the switchable first feedback component includes, at least, a capacitor.

14. The capacitive amplifier circuitry of claim 1, wherein the first kickback limiter circuitry is coupled to a node of the first amplifier stage first output and a second kickback limiter circuitry is coupled to a node of the first amplifier stage second output.

15. A method of reducing a kickback produced by switching an output stage of a capacitive amplifier circuitry, the capacitive amplifier circuitry including a first amplifier circuit stage having a first amplifier stage first output and a second amplifier circuit stage, coupled to the first amplifier stage first output, having a second amplifier stage first output, the method comprising:
connecting a first kickback limiter circuitry to a first switchable node in a first feedback path of the capacitive amplifier circuitry;
synchronizing the first kickback limiter circuitry with an activity of a first output switch; and
holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry.

16. The method of claim 15, comprising:
connecting a first kickback limiter switch in parallel with the first kickback limiter feedback component; and
controlling the first kickback limiter switch by a second clock signal that (1) closes periodically to bias a first kickback limiter amplifier input and (2) opens periodically to inject a charge associated with opening the first kickback limiter switch onto the first kickback limiter amplifier input.

17. The method of claim 16, wherein holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry includes:
using negative feedback around the first kickback limiter.

18. Capacitive amplifier circuitry with a switchable first feedback network, the capacitive amplifier circuitry including a first amplifier circuit stage having a first amplifier stage first output and a second amplifier circuit stage, coupled to the first amplifier stage first output, having a second amplifier stage first output, the capacitive amplifier circuitry comprising:
means for connecting a first kickback limiter circuitry to a first switchable node in a first feedback path of the capacitive amplifier circuitry;
means for synchronizing the first kickback limiter circuitry with an activity of a first output switch; and
means for holding a voltage level at the first switchable node, using the first kickback limiter circuitry, while a first output node of the capacitive amplifier circuitry is isolated from the first switchable node, to compensate for the kickback produced by switching the output stage of the capacitive amplifier circuitry.

19. The capacitive amplifier circuitry of claim 18, wherein the first switchable node is coupled to a switchable first feedback component in the first feedback path, and wherein the switchable first feedback component includes, at least, a capacitor.

20. The capacitive amplifier circuitry of claim 18, comprising:
second kickback limiter circuitry connected to a second switchable node.

* * * * *